United States Patent
Mohan et al.

(10) Patent No.: US 10,375,798 B2
(45) Date of Patent: Aug. 6, 2019

(54) SELF-DETERMINING A CONFIGURATION OF A LIGHT FIXTURE

(71) Applicant: enLighted, Inc., Sunnyvale, CA (US)

(72) Inventors: Tanuj Mohan, Mountain View, CA (US); Michael N. Gershowitz, San Jose, CA (US); Gaile Gordon, Palo Alto, CA (US)

(73) Assignee: Enlighted, Inc., Sunnyvale, CA (US)

( * ) Notice: Subject to any disclaimer, the term of this patent is extended or adjusted under 35 U.S.C. 154(b) by 366 days.

(21) Appl. No.: 15/334,470

(22) Filed: Oct. 26, 2016

(65) Prior Publication Data

US 2018/0116033 A1   Apr. 26, 2018

(51) Int. Cl.
 *G01J 1/42*    (2006.01)
 *G01R 31/44*   (2006.01)
 *H05B 37/02*   (2006.01)

(52) U.S. Cl.
 CPC ........ *H05B 37/0227* (2013.01); *G01J 1/4204* (2013.01); *G01R 31/44* (2013.01); *H05B 37/0218* (2013.01); *H05B 37/0272* (2013.01); *Y02B 20/46* (2013.01)

(58) Field of Classification Search
 CPC .. G01R 31/44; G01R 31/2635; G01R 31/025; G09G 3/006; G09G 3/3233
 USPC ...................................................... 324/414
 See application file for complete search history.

(56) References Cited

U.S. PATENT DOCUMENTS

| | | |
|---|---|---|
| 2,694,792 A * | 11/1954 | Kewley .................. H01K 3/305 29/705 |
| 5,101,141 A | 3/1992 | Warner et al. |
| 5,179,324 A | 1/1993 | Audbert |
| 5,191,265 A | 3/1993 | D'Aleo et al. |
| 5,283,516 A | 2/1994 | Lohoff |
| 5,812,422 A | 9/1998 | Lyons |
| 6,057,654 A | 5/2000 | Cousy et al. |
| 6,188,181 B1 | 2/2001 | Sinha et al. |
| 6,342,994 B1 | 1/2002 | Cousy et al. |
| 6,502,044 B1 | 12/2002 | Lane et al. |
| 6,548,967 B1 | 4/2003 | Dowling et al. |
| 6,577,136 B1 | 6/2003 | Marques |
| 7,309,985 B2 | 12/2007 | Eggers et al. |
| 7,348,736 B2 | 3/2008 | Piepgras et al. |
| 7,437,596 B2 | 10/2008 | McFarland |
| 7,382,271 B2 | 12/2008 | McFarland |
| 7,550,931 B2 | 6/2009 | Lys et al. |
| 7,566,137 B2 | 7/2009 | Veskovic |
| 7,623,042 B2 | 11/2009 | Huizenga |
| 7,792,956 B2 | 9/2010 | Choong et al. |
| 7,812,543 B2 | 10/2010 | Budike, Jr. |
| 7,925,384 B2 | 4/2011 | Huizenga et al. |

(Continued)

*Primary Examiner* — Christopher P McAndrew

(57) ABSTRACT

An apparatuses, methods, and systems of determining a configuration of a lighting fixture are disclosed. One embodiment method includes setting a lighting control level of a first channel control line of the lighting fixture to a plurality of levels, setting a lighting control level of a second channel control line of the lighting fixture to a plurality of levels, sensing an amount of power dissipated by the lighting fixture, comparing the sensed amount of power dissipated for each of the plurality of levels, and determining a configuration of the lighting fixture based upon the comparing of the sensed amount of power for each of the plurality of lighting control levels for the first channel and the second channel.

16 Claims, 8 Drawing Sheets

(56) References Cited

U.S. PATENT DOCUMENTS

| | | | |
|---|---|---|---|
| 8,278,845 B1 * | 10/2012 | Woytowitz | H05B 37/0263 307/1 |
| 8,339,069 B2 * | 12/2012 | Chemel | H05B 37/029 315/294 |
| 8,368,321 B2 | 2/2013 | Chemel | |
| 8,593,135 B2 * | 11/2013 | Chemel | H05B 37/029 324/105 |
| 8,593,148 B2 * | 11/2013 | Morrow | G01R 31/26 324/414 |
| 8,610,377 B2 * | 12/2013 | Chemel | H05B 37/029 315/297 |
| 8,705,023 B2 * | 4/2014 | Hong | G01J 1/0223 356/213 |
| 9,006,996 B2 | 4/2015 | Mohan et al. | |
| 9,277,632 B2 | 3/2016 | Hegarty | |
| 9,413,174 B2 * | 8/2016 | Gostein | H02S 50/10 |
| 2002/0084784 A1 * | 7/2002 | Cook | G01R 31/245 324/414 |
| 2004/0002792 A1 | 1/2004 | Hoffknecht | |
| 2004/0212321 A1 * | 10/2004 | Lys | H05B 33/0809 315/291 |
| 2005/0169643 A1 | 8/2005 | Franklin et al. | |
| 2006/0275040 A1 | 12/2006 | Franklin | |
| 2007/0057807 A1 | 3/2007 | Walters et al. | |
| 2007/0061050 A1 | 3/2007 | Hoffknecht | |
| 2007/0086128 A1 | 4/2007 | Lane et al. | |
| 2007/0152797 A1 * | 7/2007 | Chemel | H05B 33/0803 340/2.2 |
| 2007/0189026 A1 * | 8/2007 | Chemel | H05B 37/029 362/458 |
| 2007/0215794 A1 | 9/2007 | Cernasov et al. | |
| 2008/0185597 A1 | 8/2008 | Veskovic et al. | |
| 2008/0244104 A1 | 10/2008 | Clemente | |
| 2008/0265796 A1 | 10/2008 | Null | |
| 2008/0284442 A1 * | 11/2008 | Notohamiprodjo | H05B 41/2828 324/414 |
| 2009/0026966 A1 | 1/2009 | Budde et al. | |
| 2009/0179596 A1 | 7/2009 | Willaert et al. | |
| 2009/0195161 A1 | 8/2009 | Lane et al. | |
| 2009/0278479 A1 | 11/2009 | Platner et al. | |
| 2010/0034386 A1 | 2/2010 | Choong et al. | |
| 2010/0135186 A1 | 6/2010 | Choong et al. | |
| 2010/0264846 A1 | 10/2010 | Chemal et al. | |
| 2010/0270933 A1 | 10/2010 | Chemal et al. | |
| 2010/0280677 A1 | 11/2010 | Budike, Jr. | |
| 2010/0295482 A1 | 11/2010 | Chemal et al. | |
| 2010/0301777 A1 | 12/2010 | Chemal et al. | |
| 2011/0031897 A1 | 2/2011 | Henig et al. | |
| 2011/0187273 A1 * | 8/2011 | Summerford | H05B 37/02 315/152 |
| 2011/0199010 A1 | 8/2011 | Henig et al. | |
| 2012/0265467 A1 * | 10/2012 | Chang | G01R 31/2635 702/82 |
| 2012/0320627 A1 * | 12/2012 | Araki | F21S 8/04 362/608 |
| 2014/0084811 A1 * | 3/2014 | Bender | H05B 33/089 315/297 |
| 2014/0167771 A1 * | 6/2014 | Hsu | G01J 1/42 324/414 |
| 2014/0218039 A1 * | 8/2014 | Shen | H05B 33/0884 324/414 |
| 2014/0232409 A1 * | 8/2014 | Keum | G09G 3/3233 324/414 |
| 2014/0235269 A1 * | 8/2014 | Ericsson | H05B 37/0272 455/456.1 |
| 2014/0266217 A1 * | 9/2014 | Wang | G01R 31/44 324/414 |
| 2015/0048835 A1 * | 2/2015 | Lee | G01R 31/024 324/414 |
| 2015/0123667 A1 * | 5/2015 | Solarz | G01R 31/44 324/414 |
| 2015/0160275 A1 * | 6/2015 | Goergen | G01R 31/44 324/414 |
| 2015/0160305 A1 | 6/2015 | Ilyes et al. | |
| 2015/0379910 A1 * | 12/2015 | Nishinohara | G09G 3/006 345/206 |
| 2016/0178173 A1 * | 6/2016 | Yadav | F21S 2/005 362/231 |
| 2016/0212818 A1 | 7/2016 | Hegarty | |
| 2016/0286628 A1 * | 9/2016 | Cho | H05B 37/0272 |
| 2017/0105269 A1 * | 4/2017 | Balasubramainian | H05B 37/02 |
| 2017/0231069 A1 * | 8/2017 | Winslett | H05B 33/0803 |
| 2018/0129493 A1 * | 5/2018 | Deixler | H04L 12/2814 |
| 2018/0146533 A1 * | 5/2018 | Goodman | H05B 37/0272 |

\* cited by examiner

| Test | Dimming Control | Measured Power | AC Power Relay | Verification Test |
|---|---|---|---|---|
| 1 | N/A | E | OFF | E = a minimal level |
| 2 | 100% | A | ON | A > min level power |
| 3 | 20% | B | ON | B < 90% A: dimming control able to reduce load |
| 4 | 0% | C | OFF | Light off |
| 5 | 100% | D | ON | Light max brightness |

| Test | Dimming Control on Channel 1 and 2 | Measured Power | AC Power Relay | Verification Test |
|---|---|---|---|---|
| 1 | 1) N/A | E | OFF | E > min level threshold |
| 2 | 1) 100%<br>2) 0% | A | ON | A > second threshold |
| 3 | 1) 50%<br>2) 50% | B | ON | B < 2/3A indicates 1 channel only, Otherwise, a two channel fixture. |
| 4 | 1) 100%<br>2) 100% | C | ON | C > B |
| 5 | 1) 0%<br>2) 100% | D | ON | Channel 2 max brightness, C*.2 < A+D < C*.8 and D < 2/3C |

Setting, by a controller of the lighting fixture, a lighting control level of a first channel control line of the lighting fixture to a plurality of levels, wherein the first channel control line is configured to control a light intensity emitted from a first light when the first channel control line is properly connected the second light

310

↓

Setting, by a controller of the lighting fixture, a lighting control level of a second channel control line of the lighting fixture to a plurality of levels, wherein the second channel control line is configured to control a light intensity emitted from a second light when the second channel control line is properly connected the second light

320

↓

Sensing an amount of power dissipated by the lighting fixture, for each of the plurality of levels of the lighting control level of the first channel control line and for each of the plurality of levels of the lighting control level of the second channel control line

330

↓

Comparing the sensed amount of power dissipated for each of the plurality of levels

340

↓

Determining a configuration of the lighting fixture based upon the comparing of the sensed amount of power for each of the plurality of lighting control levels for the first channel and the second channel

| Test | Dimming Control on Channel 1 and 2 | Measured Power | Verification Test (Sensed Color of Light) |
|---|---|---|---|
| 1 | 1) 100%<br>2) 0% | A | (RA, BA, GA) |
| 2 | 1) 0%<br>2) 100% | D | (RD, BD, GD) |

Sensing, by an ambient light sensor, levels of received light for different ranges of wavelengths

510

Identifying at least one of the first channel and the second channel as a particular color based on the sensed levels of received light for different ranges of wavelengths

520

SELF-DETERMINING A CONFIGURATION OF A LIGHT FIXTURE

FIELD OF THE EMBODIMENTS

The described embodiments relate generally to lighting. More particularly, the described embodiments relate to self-determining a configuration of a light fixture.

BACKGROUND

Lighting control can be used to automatically control lighting under certain conditions, thereby conserving power. However, lighting control, specifically advanced lighting controls have not been widely adopted in the general commercial market because the installation, setup related costs and complexity have made these lighting systems prohibitively expensive for most commercial customers. Additionally, if these systems include intelligence, they are centrally controlled.

A common type of lighting fixture contains one LED (light emitting diode) channel which is controlled by a single channel dimming control. The dimming control can be analog, for instance a 0 to 10 v signal, or digital, for instance DALI (digital addressable lighting interface) or other control type. All the LEDs in the fixture are controlled by a single driver at the same dimming level. Some fixtures now have more than one LED channel or driver. Dual channels can be used to control for instance two long linear units to extend the size of the fixture, an indirect and direct light (up/down) lights in the same fixture, or two different color temperature LEDs. To control the fixture correctly, it must be known how many channels are present, and if there are two, which LED channel belongs to which control line.

It is desirable to have a lighting method, system and apparatus for self-configuration and testing of a lighting fixture that includes more than one channel.

SUMMARY

One embodiment includes a method of determining a configuration of a lighting fixture. The method includes setting, by a controller of the lighting fixture, a lighting control level of a first channel control line of the lighting fixture to a plurality of levels, wherein the first channel control line is configured to control a light intensity emitted from a first light when the first channel control line is properly connected the first light, setting, by the controller of the lighting fixture, a lighting control level of a second channel control line of the lighting fixture to a plurality of levels, wherein the second channel control line is configured to control a light intensity emitted from a second light when the second channel control line is properly connected the second light, sensing an amount of power dissipated by the lighting fixture, for each of the plurality of levels of the lighting control level of the first channel control line and for each of the plurality of levels of the lighting control level of the second channel control line, comparing the sensed amount of power dissipated for each of the plurality of levels, and determining a configuration of the lighting fixture based upon the comparing of the sensed amount of power for each of the plurality of lighting control levels for the first channel and the second channel.

Another embodiment includes lighting fixture. The lighting fixture includes a first channel control line configured to control a light intensity emitted from a first light of the lighting fixture when properly connected, a second channel configured to control a light intensity emitted from a second light of the lighting fixture when properly connected, a power meter configured to sense power dissipated by the light fixture, and a controller. For an embodiment, the controller is configured to set a lighting control level of the first channel control line of the lighting fixture to a plurality of levels, set a lighting control level of the second channel control line of the lighting fixture to a plurality of levels, receive from the power meter a sensed amount of power dissipated by the lighting fixture, for each of the plurality of levels of the lighting control level of the first channel control line and for each of the plurality of levels of the lighting control level of the second channel control line, compare the sensed amount of power dissipated for each of the plurality of levels, and determine a configuration of the lighting fixture based upon the comparing of the sensed amount of power for each of the plurality of lighting control levels for the first channel control line and the second channel control line.

Other aspects and advantages of the described embodiments will become apparent from the following detailed description, taken in conjunction with the accompanying drawings, illustrating by way of example the principles of the described embodiments.

BRIEF DESCRIPTION OF THE DRAWINGS

FIG. 3 is a flow chart that includes steps of a method of controlling the light fixture of FIG. 1, according to an embodiment.

DETAILED DESCRIPTION

The described embodiments are embodied in apparatuses, system and methods for automatically self-determining a configuration of a light fixture. Further, at least some of the described embodiments include automatic testing for correct wiring of the light fixture at manufacturing or installation. At least some embodiments include a common test for a wide variety of different fixtures—so that changes are not required to existing manufacturing flow, and so that the same software and/or firmware can be used without having to know a detailed configuration of the light fixture.

Figures 1A, 1B:
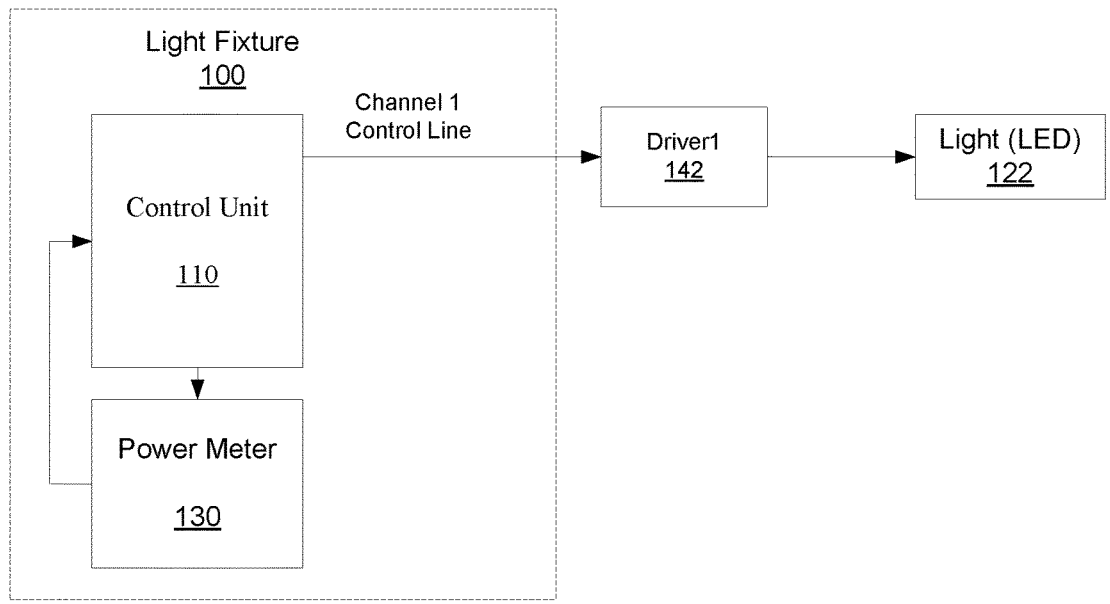
FIG. 1A shows a light fixture that includes a control unit, a power meter, and a single channel, according to an embodiment.
FIG. 1B is a table that includes a series of tests for the single channel system of FIG. 1A, according to an embodiment.

FIG. 1A shows a light fixture 100 that includes a control unit 110, a power meter 130, and a single channel, according to an embodiment. The control unit 110 controls the generation of a channel 1 control line which controls a first driver (Driver1) 142. The first driver 142 controls an intensity of light emitted from a light 122. For an embodiment, the light 122 is an LED (light emitting diode).

The power meter 110 senses power dissipated by the light fixture 100. The various controls and operations of the light fixture 100 cause the light fixture 100 to consume or dissipate different levels of power. For example, if properly connected, setting the signal level of the first driver control line to different levels causes different levels of dissipated power by the light fixture.

FIG. 1B is a table that includes a series of tests for the single channel system of FIG. 1A, according to an embodiment. For an embodiment, a test (test 1 of table 1) for a single channel fixture includes providing a sequence of dimming levels, power relay settings, and measuring power at each level. According to an embodiment, a first test verifies the power wiring between the control unit 110 and the Driver 142. An AC power test is realized, for example, by closing or opening a relay 622 of FIG. 6 as will be described later. The relay 622 either provides power (closed) to the driver 142, or provides for no power (open) to the driver 142. The power meter 130 may sense a level of power dissipation of the light fixture 100 of E.

For an embodiment, a second test (Test 2 from table 1) includes controlling the light fixture 100 with the brightest dimming control (100%, wherein 100% indicates 100% of the maximum brightness setting). If the power measured, A, is above some reasonable minimum detectable level, this shows there is a load correctly connected to the driver 143. In a typical system, power measured with no load would indicate a very low value (the power consumption of the sensor alone), whereas even the smallest LED unit at full dimming level will read a much higher level of power consumption.

The third test (Test 3 of table 1) includes reducing the dimming control, for example, to 20%, wherein 20% indicates 20% of the maximum brightness setting. The power measured at this point, B, is expected to be lower than A. Even with rough calibration of the dimming, and to allow for different drivers, if B is lower than 90% of A, there is strong evidence that the dimming is functional to lower the brightness of the light.

A fourth test (test 4 of table 1) includes driving the light fixture at the minimum dimming control value (0%). The light 122 should be visibly confirmed by an operator or installer to be at the minimum brightness. The power meter 130 may sense a level of power dissipation of the light fixture 100 of C.

A fifth test (test 5 of table 1) includes driving the fixtures at 100% dimming control to verify full brightness of the fixture. The power meter 130 may sense a level of power dissipation of the light fixture 100 of D. The last two tests (4 and 5) are used to identify that the LED unit is functional.

An ambient light sensor could optionally be used in tests 4 and 5. Ambient light sensed will be a combination of the light from the fixture and other light in the area, for instance from a window or other fixtures. If these conditions can be controlled, for instance in a manufacturing facility, the ambient sensor can be used instead of the visible test to fully automate the tests.

Figures 2A, 2B:
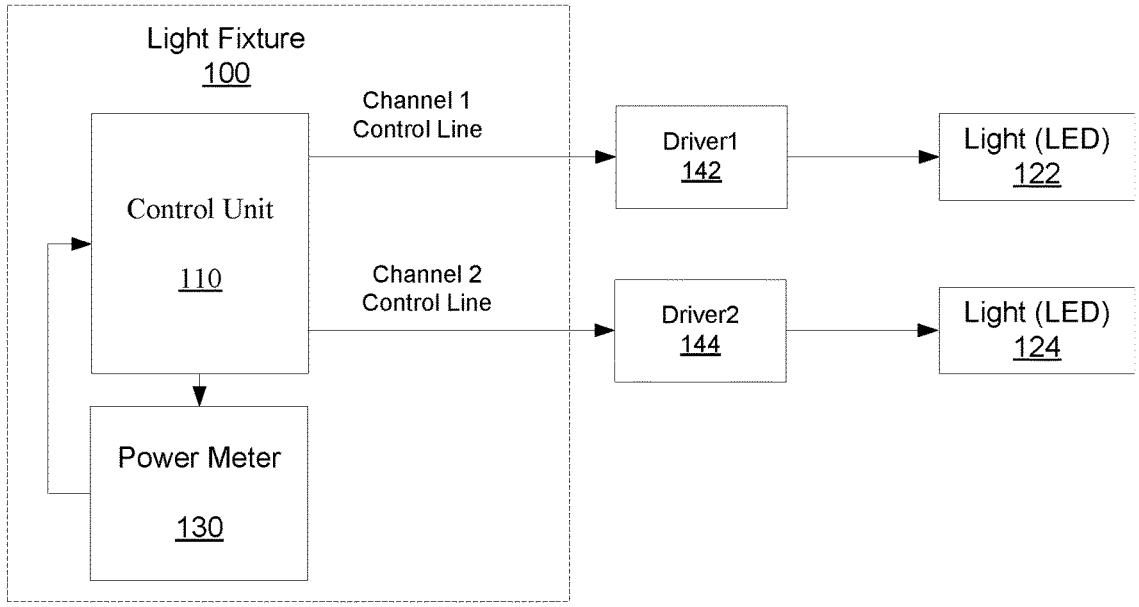
FIG. 2A shows a light fixture that includes a control unit, a power meter, and multiple channels, according to an embodiment.
FIG. 2B is a table that includes a series of tests for the dual channel system of FIG. 2A, according to an embodiment.

FIG. 2A shows a light fixture 100 that includes the control unit 110, the power meter 130, and multiple channels (Channel 1, Channel 2), according to an embodiment. This embodiment further includes a channel 2 control line which controls a second driver (Driver2) 144 which controls the intensity of light emitted from a second light 124. For an embodiment, the light 124 is an LED (light emitting diode).

For an embodiment, the light fixture 100 is operative to self-determine the configuration the light fixture. That is, the light fixture 100 may be configured as a single channel fixture as shown in FIG. 1A, or the light fixture 100 may be configured as a dual channel fixture as shown in FIG. 2A. For an embodiment, the configuration can be determined by the control unit varying control of the channel 1 control line and the channel 2 control line, and monitoring the power dissipated by the light fixture while varying control of the channel 1 control line and the channel 2 control line.

It is to be realized that while the describe embodiments only include one or two channels, the described embodiments can be extended to any number of channel drivers When the control unit is determining whether it controls a single or dual channel fixture, the complexity of the test of the configuration is greater. For an embodiment, a test for a dual channel light fixture includes providing a sequence of dimming levels, power relay settings, and measuring power at each level.

FIG. 2B is a table that includes a series of tests for the dual channel system of FIG. 2A, according to an embodiment. A first test (test 1 table 2) verifies the power wiring between the control unit 110 and the Drivers 142, 144. The AC Power Relay (as depicted by the relay 622 in FIG. 6) is turned off (dimming controls not applicable in this state). In this state, the only power used is what is drawn by the sensor and control unit, which is minimal, but not zero. If the sensed power dissipation is zero, this indicates a power wiring error (the control unit 110 is bypassed or mis-wired), or the control unit is defective. The power meter 130 may sense a level of power dissipation of the light fixture 100 of E.

An embodiment includes first identifying the number of channels of the light fixture. For at least some embodiments, this includes a two-step test. A first step (test 2 of table 2) of the two-step test includes verifying a minimum load on the channel 1 control line. The dimming control of channel 1 is set to 100% and the dimming control of channel 2 is set to 0%. The power measured in this configuration is A. If the power measured, A, is above some reasonable minimum detectable level (second threshold), this shows there is a load correctly connected to the driver 142. In a typical system, power measured with no load would indicate a very low value (the power consumption of the sensor alone), whereas a even the smallest LED unit at full dimming level will read a higher power consumption.

The second test (test 3 table 2) controls the two channels (the channel 1 control line and the channel 2 control line) at equal 50% levels. Typically for a two channel configuration the power measured, B, is approximately the same as A, whereas a single channel configuration reads B much less than A. For an embodiment, for the one channel configuration, the testing includes a return to step 2 of the table of FIG. 1B.

For a detected dual channel configuration, the test continues with tests 4 and 5 of the table of FIG. 2B to verify dimming capability on both channels. Test 4 includes setting channel 1 to 100% and channel 2 to 100%, and the power meter measuring a power level of C. Test 5 includes setting channel 2 to 0% and channel 2 to 100%, and the power meter measuring a power level of D.

If correctly connected, then A+D should be approximately equal to C. Again to allow for different configurations and drivers, a conservative test such as C*0.2<A+D<C*0.8 may be used. D should also be much less than C, and the test can include determining that D<2/3 C. The combination of these tests can be used to confirm the connections and drivers on each channel.

FIG. 3 is a flow chart that includes steps of a method of controlling the light fixture of FIG. 1B, according to an embodiment. A first step 310 includes setting, by a controller of the lighting fixture, a lighting control level of a first channel control line of the lighting fixture to a plurality of levels, wherein the first channel control line is configured to control a light intensity emitted from a first light when the first channel control line is properly connected the first light. A second step 320 includes setting, by the controller of the lighting fixture, a lighting control level of a second channel control line of the lighting fixture to a plurality of levels, wherein the second channel control line is configured to control a light intensity emitted from a second light when the second channel control line is properly connected the second light. A third step 330 includes sensing an amount of power dissipated by the lighting fixture, for each of the plurality of levels of the lighting control level of the first channel control line and for each of the plurality of levels of the lighting control level of the second channel control line. A fourth step 340 includes comparing the sensed amount of power dissipated for each of the plurality of levels. A fifth step 350 includes determining a configuration of the lighting fixture based upon the comparing of the sensed amount of power for each of the plurality of lighting control levels for the first channel and the second channel. For an embodiment, determining the configuration of a lighting fixtures includes determining if the fixture is connect to one or more driver loads For an embodiment the steps of FIG. 3 are performed after verification of the power wiring. If power wiring error was present the power measurements would not be indicative of the correct fixture state.

For an embodiment, the first channel control line is configured to control the light intensity emitted from the first light comprise the first channel control line being connected to a first driver, and wherein the second channel control line is configured to control the light intensity emitted from the second light comprise the second channel control line being connected to a second driver.

For an embodiment, setting the lighting control level of the first channel control line of the lighting fixture to the plurality of levels and setting the lighting control level of the second channel comprises at least setting the lighting control of the first channel control line to approximately 100% and the lighting control of the second channel control line to approximately 0%, and further comprising sensing a first sensed power level of the fixture, and confirming that the first sensed power level is greater than a first predetermined threshold. For an embodiment these steps are an implementation of test 2 of the table of FIG. 2B.

For an embodiment, setting the lighting control level of the first channel control line control line of the lighting fixture to the plurality of levels and setting the lighting control level of the second channel control line comprises at least setting the lighting control of the first channel to approximately 50% and the lighting control of the second channel control line to approximately 50%, and further comprising sensing a second sensed power level of the fixture, and determining that the lighting fixture is a single channel lighting fixture if the second sense power level is less than a predetermined ratio (for an embodiment, the predetermine ratio is 2/3) of the first sensed power level, and determining the lighting fixture is a duel channel lighting fixture if the second sensed power level is more than predetermined ratio (as stated, for an embodiment, the predetermine ratio is 2/3) of the first sensed power level. For an embodiment these steps are an implementation of test 3 of the table of FIG. 2B.

For an embodiment, setting the lighting control level of the first channel control line of the lighting fixture to the plurality of levels and setting the lighting control level of the second channel control line comprises at least setting the lighting control of the first channel control line to approximately 100% and the lighting control of the second channel control line to approximately 100%, and further comprising sensing a third sensed power level of the fixture, and determining that the first channel control line and the second channel control line are properly connected and drivers are operable if the third sensed power level is greater than the first sensed power level and the second sensed power level. A visual test that each light is at maximum brightness level confirms that the fixture is properly operating. For an embodiment these steps are an implementation of test 4 of the table of FIG. 2B.

For an embodiment, setting the lighting control level of the first channel control line of the lighting fixture to the plurality of levels and setting the lighting control level of the second channel control line comprises at least setting the lighting control of the first channel control line to approximately 0% and the lighting control of the second channel control line to approximately 100%, and further comprising sensing a third sensed power level of the fixture, and determining that the first channel control line and the second channel control line are properly connected and drivers are operable if a second predetermined ratio (for an embodiment, the second predetermine ratio is 0.2) of the third sensed power level is less than a sum of the first sensed power level and the second sensed power level, and the sum of the first sensed power level and the second sensed power level is less than a third predetermine ratio (for an embodiment, the third predetermine ratio is 0.8) of the third sensed power level, and the fourth sensed power level is less than a fourth predetermine ratio (for an embodiment, the fourth predetermine ratio is 2/3) of the third sensed power level. For an embodiment this test confirms that both dimming channels and corresponding drivers and lights are operational. For an embodiment these steps are an implementation of test 5 of the table of FIG. 2B.

Figures 4A, 4B:
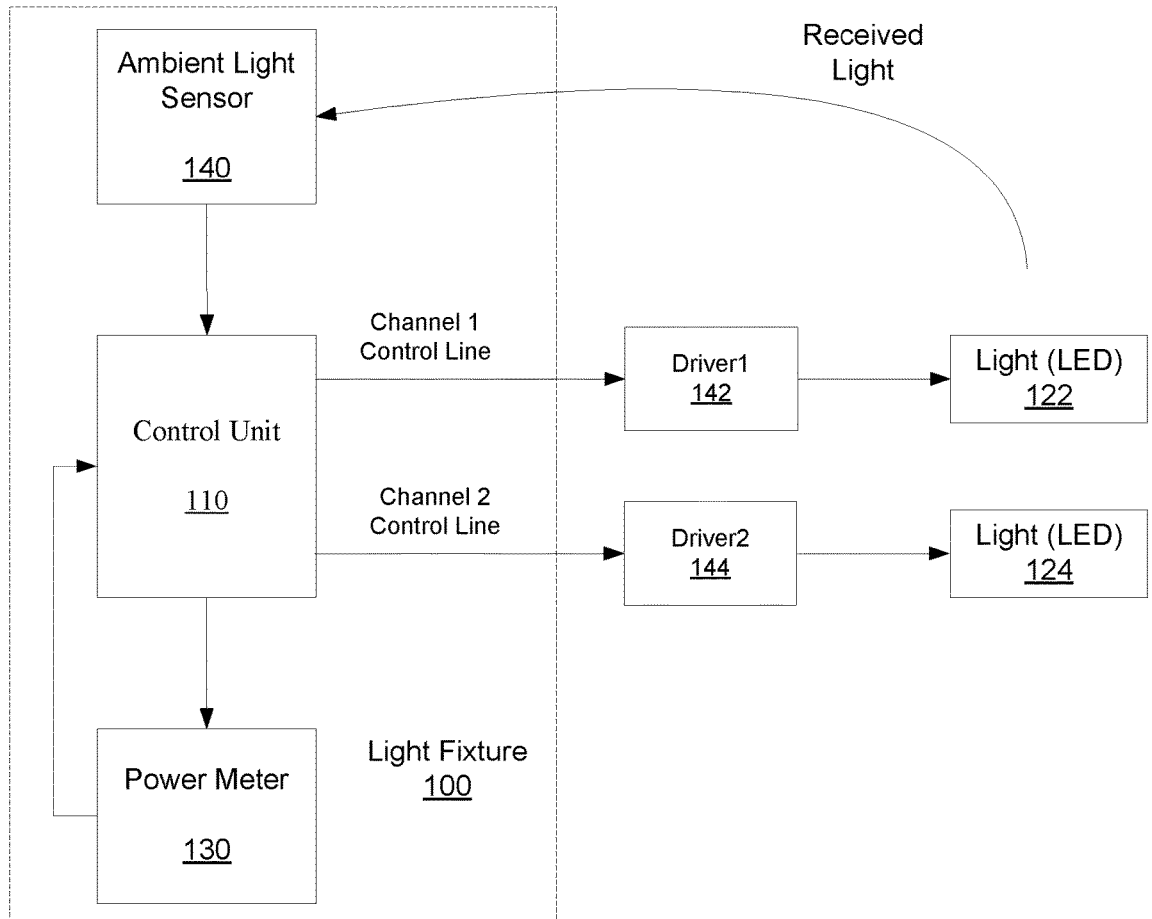
FIG. 4A shows a light fixture that includes a control unit, a power meter, an ambient light sensor, and multiple channels, according to an embodiment.
FIG. 4B is a dimming control table that includes dimming control of the two channels, measured power, and sensed colors of light for the light fixture of FIG. 4A, according to an embodiment.

FIG. 4A shows a light fixture that includes a control unit 110, a power meter 130, an ambient light sensor 140, and multiple channels (Channel 1 control line, Channel 2 control line, Driver1 142, Driver2 144), according to an embodiment. As shown, the ambient light sensor 140 is configured to receive light from the light 122 controlled by the Channel 1 control line and the light 124 controlled by the Channel 2 control line.

FIG. 4B is a table that includes dimming control of the two channels, measured power, and sensed colors of light for the light fixture of FIG. 4A, according to an embodiment. A first test includes setting the first channel to 100% and the second channel to 0%. The second test includes setting the first channel to 0% and the second channel to 100%. The power meter 130 sensed power levels of A and D for the two tests. The previously described power tests cannot determine if the two channels represent a tunable white configuration with different LED colors on each channel. For at least some embodiments, tunable white configurations use one cool white LED, for instance 6000 CCT (correlated color temperature) and one warm white LED, for instance 2700 CCT. The total output of the fixture is blended using a diffuser to reach any combination of the two CCT colors. Use of an RGB ambient sensor on the fixture can confirm, using test 1 and 2 of the table of FIG. 4B whether there is a significant difference of red/blue. At least some embodiments include confirmation or automatic configuration of which channel is connected to the warm LED and which channel is connected to the cool LED. Warm CCT colors have a higher red and lower blue wavelengths compared to cool CCT colors.

Again referring to the table of FIG. 4B, RA is a sensed level of red light, BA is a sensed level of blue light, and GA is a sensed level of green light for test 1; RD is a sensed level of red light, BD is a sensed level of blue light, and GD is a sensed level of green light for test 2. For an embodiment, if (RA/BA)<<(RD/BD) then channel 1 is cool and channel 2 is warm. For an embodiment, if (RA/BA)>>(RD/BD) →channel 2 is cool and channel 1 is warm. Otherwise, if the ratios are similar in test 1 and 2, the light fixture is not a tunable white fixture.

At least some embodiments include some control over the ambient environment of the fixture is required. For instance, if the ambient light not from the fixture (either channel 1 or 2) is extremely bright, there may not be a detectable difference measured when the fixture is configured on full brightness on either channel. The total ambient light measurement in either case 1 or 2, must be confirmed to be higher in magnitude than the total ambient light measurement with the fixture power off.

Figure 5:
FIG. 5 is a flow chart that includes steps of a method of controlling the light fixture of FIG. 3, according to an embodiment.

FIG. 5 is a flow chart that includes steps of a method of controlling the light fixture of FIG. 4A, according to an embodiment. A first step 510 includes sensing, by an ambient light sensor, levels of received light for different ranges of wavelengths. A second step 520 includes identifying at least one of the first channel and the second channel as a particular color based on the sensed levels of received light for different ranges of wavelengths.

For at least some embodiments, the sensing, by the ambient light sensor, is performed after determining the light fixture is in a controlled environment. For example, performing the sensing while the light fixture is in the dark allows for more accurate sensing of the ambient light of the lights 122, 124 because when the light fixture is in the dark other sources of ambient light are minimized. Accordingly, an embodiment includes timing the sensing of ambient light to occur at a time in which other sources of ambient light around the light fixture are controlled, such as, at night.

An embodiment includes identifying at least one of the first channel and the second channel as a warm light based on the sensed levels of received light for different ranges of wavelengths. For an embodiment, identifying at least one of the first channel and the second channel as a warm light comprises determining a ratio of sensed red light to sensed blue light.

An embodiment includes identifying at least one of the first channel and the second channel as a cool light based on the sensed levels of received light for different ranges of wavelengths. For an embodiment, identifying at least one of the first channel and the second channel as a cool light comprises determining a ratio of sensed red light to sensed blue light.

Figure 6:
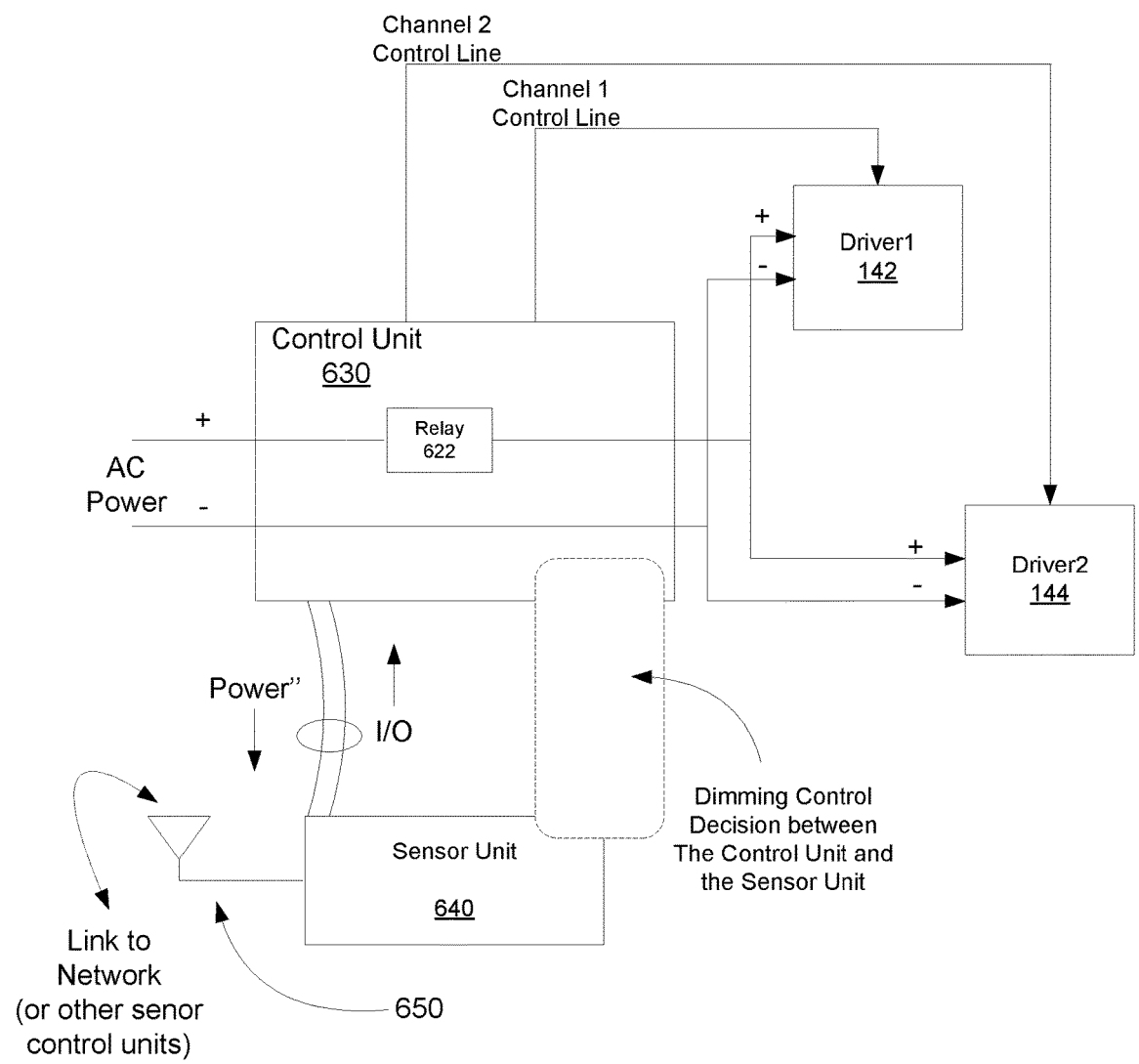
FIG. 6 shows another light fixture, according to an embodiment.

FIG. 6 shows another light fixture, according to an embodiment. This embodiment includes the previously described relay 622. The relay 622 receives AC power and, as previously described, the relay 622 either provides power (closed) to the drivers 142, 144, or provides for no power (open) to the drivers 142, 144. As shown, for an embodiment, the relay 622 is included within the control unit 630. As previously described, if properly connected, the control unit 622 controls the light intensity of the lights 122, 144 through the channel control lines (Channel 1 Control Line, Channel 2 Control Line) through the drivers (Driver1 142, Driver2, 144).

For an embodiment, the relay 622 is turned off (dimming controls not applicable in this state). In this state, the only power used is what is drawn by the sensor and CU, which is minimal, but not zero. If the sensed power dissipation is zero, this indicates a power wiring error (the CU power meter 130 is bypassed or mis-wired, or the CU 630 is defective).

For an embodiment, the control unit 630 provides power to a sensor unit 640, and the sensor unit 640 provides at least some digital control of the control unit 630. Further, for at least some embodiments, the sensor unit 640 includes a wireless interface (including antenna 650) that provides a communication channel for the light fixture, thereby connecting the light fixture to other fixtures or a central controller. As shown, the dimming control decisions and processing can be shared between the control unit 630 and the sensor unit 640

Figure 7A:
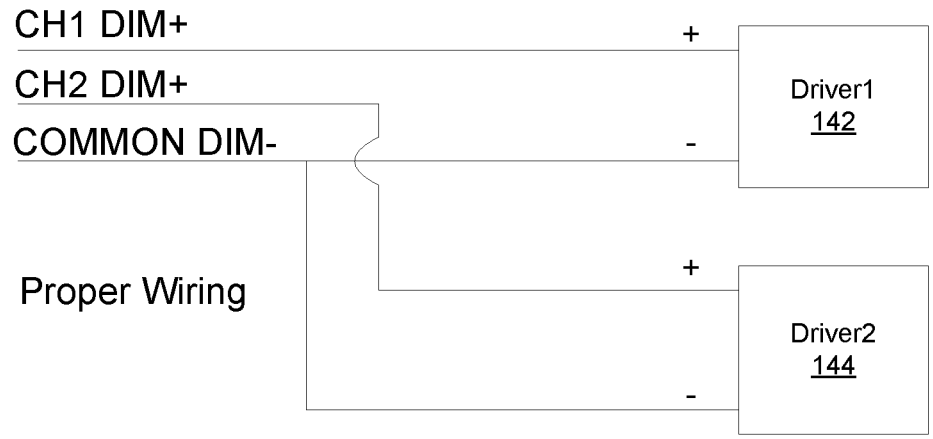
FIGS. 7A and 7B show examples of proper and improper wiring between the control unit and the drivers, according to an embodiment.
Figure 7B:
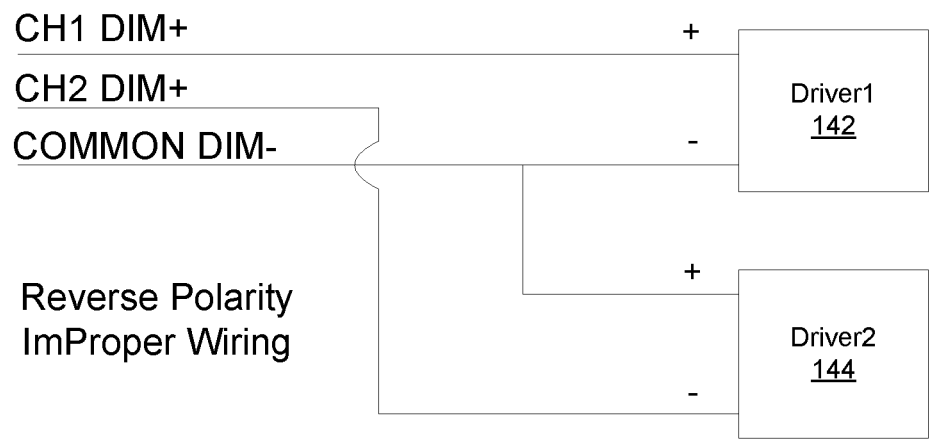

FIGS. 7A and 7B show examples of proper and improper wiring between the control unit and the drivers, according to an embodiment. FIG. 7A shows the wiring in which the dimming control line (CH1 DIM+) is properly connected to the Driver1 142, and the dimming control line (CH2 DIM+) is properly connected to the Driver2 144. Further, the common voltage line (COMMON DIM−) is properly connected to the Driver1 142 and the Driver2 144.

FIG. 7B shows a potential problem with the connection in which the dimming control line (CH2 DIM+) and the common voltage line (COMMON DIM−) are inadvertently reversed.

Figure 8:
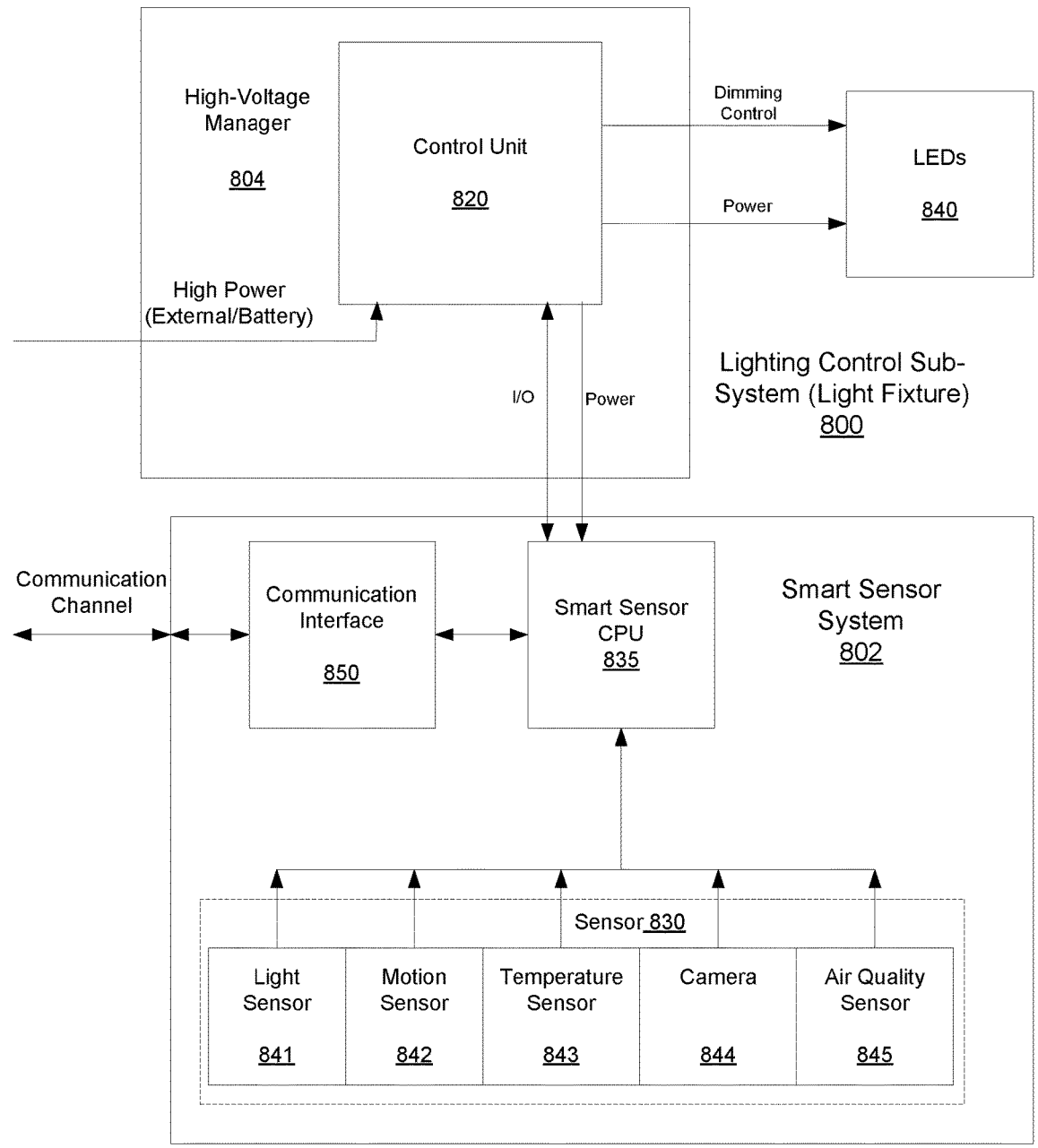
FIG. 8 shows another light fixture, according to an embodiment.

FIG. 8 shows another light fixture 800, according to an embodiment. More specifically, Control Unit 820 is connected to a LEDs 840, and provides a dimming control and power for controlling the intensity of light emitted from the LEDs 840. Note that the drivers are not depicted in this embodiment. Additionally, a sensor unit 802 is connected to the Control Unit 820. The control unit 820 can be located within a high-voltage manager 804 that receives power which is distributed to the control unit 820 and a smart sensor system 802.

For an embodiment, the Control Unit 820 (of the high-voltage manager 804) provides power to the smart sensor system 802, which includes smart sensor CPU 835, and the smart sensor CPU 835 provides control signals to the Control Unit 820. This embodiment further includes a communications link being established between the smart sensor system 802 and a network or other devices. Rather than being connected to the network, the sensor unit smart sensor system 802 includes a communication interface 850 that can connect to other sensor units and Control Units, allowing for decentralized control of a plurality of light fixtures. For a specific embodiment, the sensor unit 802 includes at least one antenna and is wirelessly linked (through, for example, BLUETOOTH® or ZIGBEE®) to the network, or other devices.

For an embodiment, the conductor providing power from the high-voltage manager 804 to the smart sensor system 802, and the conductor(s) providing control signal(s) from the smart sensor system 802 to the high-voltage manager 804 are located in a common cable. For an embodiment, the voltage providing to power the smart sensor system 802 is, for example, a low-power DC voltage. Being a low voltage, the smart sensor system 802 can be connected, and reconnected to the high-voltage manager 804 by a lay-person (that is, a skilled, high-cost technician is not required for deploying the LED lighting system). That is, the voltage supply is low enough that, for example, replacement of the sensor unit is safe enough that an electrician is not required to make the replacement.

For an embodiment, the smart sensor system 802 is attached to a ceiling proximate to the high-voltage manager 804. The cable allows for easy installation. Exemplary cables include a cable with a RJ-45, RJ-50 like connector at either end. Flat cables can be desirable because that can easily slip easily between a guide-rail and a ceiling tile of a typical industrial ceiling, without requiring a hole in a ceiling tile.

Embodiments include all of the LED processing based on the sensed signals and any network input occurring all or partially within the sensor system 802. Other embodiments include varying amount of the driver control processing occurring within the Control Unit 820 of the high-voltage manager 804. The dimming control decisions can be distributed between the Control Unit 820 and the sensor unit CPU 835.

An existing light fixture can be upgraded as shown without having to modify or update existing electrical wiring and switches. This is very desirable because the upgrade is easy, fast and inexpensive to implement. Once upgraded, many light fixtures can be managed with decentralized control. Decentralized control is desirable over centralized control because there is not a single point of failure. A purchaser of the retrofit kits can upgrade existing light fixtures over time.

The smart sensor system 802 includes sensors 830 (light or ambient light sensor 841, motion sensor 842, temperature sensor 843, camera 844, and/or air quality sensor 845) that sense conditions that are used for controlling the intensity of light emitted from the LEDs 840. Such sensed signals include at least one of motion, light, temperature, images, etc. It is to be understood that this is not an exhaustive list of possible sensed conditions.

Although specific embodiments have been described and illustrated, the described embodiments are not to be limited to the specific forms or arrangements of parts so described and illustrated. The embodiments are limited only by the appended claims.

What is claimed:

1. A method of determining a configuration of a lighting fixture, comprising:
    setting, by a controller of the lighting fixture, a lighting control level of a first channel control line of the lighting fixture to a plurality of levels, wherein the first channel control line is configured to control a light intensity emitted from a first light when the first channel control line is properly connected the first light, and wherein the second channel control line is connected to a second driver;
    setting, by the controller of the lighting fixture, a lighting control level of a second channel control line of the lighting fixture to a plurality of levels, wherein the second channel control line is configured to control a light intensity emitted from a second light when the second channel control line is properly connected the second light, and wherein the first channel control line is connected to a first driver;
    sensing an amount of power dissipated by the lighting fixture, for each of the plurality of levels of the lighting control level of the first channel control line and for each of the plurality of levels of the lighting control level of the second channel control line;
    comparing to one another the sensed amount of power dissipated for each of the plurality of levels;
    determining a configuration of the lighting fixture based upon the comparing of the sensed amount of power for each of the plurality of lighting control levels for the first channel and the second channel,
    controlling opening and closing of a relay within the controller, wherein the relay is operative electrically connect electrical power to the first driver and the second driver;
    sensing an amount of power dissipated by the lighting fixture when the relay is open and closed; and
    determining whether the controller electrically connected properly based on a comparison of the sensed amount of power dissipated by the lighting fixture when the relay is open and closed.

2. The method of claim 1, wherein setting the lighting control level of the first channel control line of the lighting fixture to the plurality of levels and setting the lighting control level of the second channel comprises at least setting the lighting control of the first channel control line to approximately 100% and the lighting control of the second channel control line to approximately 0%, and further comprising sensing a first sensed power level of the fixture, and confirming that the first sensed power level is greater than a first predetermined threshold.

3. The method of claim 2, wherein setting the lighting control level of the first channel control line control line of the lighting fixture to the plurality of levels and setting the lighting control level of the second channel control line comprises at least setting the lighting control of the first channel to approximately 50% and the lighting control of the second channel control line to approximately 50%, and further comprising sensing a second sensed power level of the fixture, and determining that the lighting fixture is a single channel lighting fixture if the second sense power level is less than a predetermined ratio of the first sensed power lever, and determining the lighting fixture is a duel channel lighting fixture if the second sensed power level is greater than the predetermined ratio of the first sensed power level.

4. The method of claim 3, wherein setting the lighting control level of the first channel control line of the lighting fixture to the plurality of levels and setting the lighting control level of the second channel control line comprises at least setting the lighting control of the first channel control line to approximately 100% and the lighting control of the second channel control line to approximately 100%, and further comprising sensing a third sensed power level of the fixture, and determining that the first channel control line and the second channel control line are properly connected if the third sensed power level is greater than the first sensed power level and the second sensed power level.

5. The method of claim 4, wherein setting the lighting control level of the first channel control line of the lighting fixture to the plurality of levels and setting the lighting control level of the second channel control line comprises at least setting the lighting control of the first channel control line to approximately 0% and the lighting control of the second channel control line to approximately 100%, and further comprising sensing a third sensed power level of the fixture, and determining that the first channel control line and the second channel control line are properly connected if a second predetermine ratio of the third sensed power level is less than a sum of the first sensed power level and the second sensed power level, and the sum of the first sensed power level and the second sensed power level is less than a third predetermine ratio of the third sensed power level, and the fourth sensed power level is less than a fourth predetermine ration of the third sensed power level.

6. The method of claim 1, further comprising:
measuring an intensity of light emitted from the first light and the second light for each of the plurality of levels of the lighting control level of the first channel control line and for each of the plurality of levels of the lighting control level of the second channel control line;
comparing the measuring the intensity of light for each of the plurality of levels; and
further determining the configuration of the lighting fixture based upon the measuring of the intensity of light for each of the plurality of levels for the first channel control line and the second channel control line.

7. The method of claim 1, further comprising:
sensing, by an ambient light sensor, levels of received light for different ranges of wavelengths.

8. The method of claim 7, wherein the sensing, by the ambient light sensor, is performed after determining the light fixture is in a controlled environment.

9. The method of claim 7, identifying at least one of the first channel and the second channel as a particular color based on the sensed levels of received light for different ranges of wavelengths.

10. The method of claim 9, identifying at least one of the first channel and the second channel as a warm light based on the sensed levels of received light for different ranges of wavelengths.

11. The method of claim 10, wherein identifying at least one of the first channel and the second channel as a warm light comprises determining a ratio of sensed red light to sensed blue light.

12. The method of claim 9, identifying at least one of the first channel and the second channel as a cool light based on the sensed levels of received light for different ranges of wavelengths.

13. The method of claim 12, wherein identifying at least one of the first channel and the second channel as a cool light comprises determining a ratio of sensed red light to sensed blue light.

14. A lighting fixture, comprising:
a first channel control line configured to control a light intensity emitted from a first light of the lighting fixture when properly connected, wherein the first channel control line is connected to a first driver;
a second channel configured to control a light intensity emitted from a second light of the lighting fixture when properly connected, wherein the second channel control line being is connected to a second driver;
a power meter configured to sense power dissipated by the light fixture;
a controller including a relay, wherein the relay is configured to electrically connect electrical power to the first driver and the second driver, the controller configured to:
set a lighting control level of the first channel control line of the lighting fixture to a plurality of levels;
set a lighting control level of the second channel control line of the lighting fixture to a plurality of levels;
receive from the power meter a sensed amount of power dissipated by the lighting fixture, for each of the plurality of levels of the lighting control level of the first channel control line and for each of the plurality of levels of the lighting control level of the second channel control line;
compare to one another the sensed amount of power dissipated for each of the plurality of levels;
determine a configuration of the lighting fixture based upon the comparing of the sensed amount of power for each of the plurality of lighting control levels for the first channel control line and the second channel control line;
control opening and closing of the relay, wherein the relay is operative electrically connect electrical power to the first driver and the second driver;
receive a sensed an amount of power dissipated by the lighting fixture when the relay is open and closed from the power meter; and
determine whether the controller electrically connected properly based on a comparison of the sensed amount of power dissipated by the lighting fixture when the relay is open and closed.

15. The light fixture of claim 14, further comprising:
an ambient light sensor configured to measure an intensity of light emitted from the first light and the second light for each of the plurality of levels of the lighting control level of the first channel control line and for each of the plurality of levels of the lighting control level of the second channel control line;
wherein the controller is operative to:
compare the measuring the intensity of light for each of the plurality of levels; and
determine the configuration of the lighting fixture based upon the measuring of the intensity of light for each of the plurality of levels for the first channel control line and the second channel control line.

16. The light fixture of claim 14, further comprising:
an ambient light sensor operative to sense levels of received light for different ranges of wavelengths.

* * * * *